(12) United States Patent
Yoshikawa et al.

(10) Patent No.: US 6,524,693 B2
(45) Date of Patent: Feb. 25, 2003

(54) CERAMIC SLURRY COMPOSITION, CERAMIC GREEN SHEET AND MULTILAYER CERAMIC ELECTRONIC PART

(75) Inventors: Norihiro Yoshikawa, Kouka-gun (JP); Tomoaki Onoue, Otsu (JP); Atsuhiro Torii, Otsu (JP); Kenji Tanaka, Gamo-gun (JP); Masaru Kojima, Hikone (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 10/026,325

(22) Filed: Dec. 24, 2001

(65) Prior Publication Data

US 2002/0122924 A1 Sep. 5, 2002

(30) Foreign Application Priority Data

Dec. 27, 2000 (JP) ........................................ 2000-398566

(51) Int. Cl.⁷ .............................. B32B 3/26; H01G 4/06
(52) U.S. Cl. ................................ 428/321.1; 428/423.1; 428/424.2; 361/307; 361/321.1; 361/321.5
(58) Field of Search ....................... 428/321.1, 423.1, 428/424.2; 361/307, 321.1, 321.5

(56) References Cited

U.S. PATENT DOCUMENTS

| | | | |
|---|---|---|---|
| 4,104,345 A | * | 8/1978 | Anderson et al. .............. 264/43 |
| 5,064,596 A | * | 11/1991 | Chida et al. .................. 264/181 |
| 5,925,444 A | * | 7/1999 | Katsumura et al. ......... 428/209 |

FOREIGN PATENT DOCUMENTS

JP          08-183663          7/1996

* cited by examiner

*Primary Examiner*—Cathy Lam
(74) *Attorney, Agent, or Firm*—Dickstein, Shapiro, Morin & Oshinsky LLP

(57) ABSTRACT

A ceramic green sheet is formed from a ceramic slurry composition comprising a ceramic powder such as $BaTiO_3$, a vehicle in the state of emulsion in which an organic binder consisting of polyurethane resin particles having an average particle size of about 120 nm or less is dispersed in an aqueous solvent, and a surfactant comprising an alkyne glycol having one or more triple bonds in its molecule and/or an ethylene oxide addition product of such an alkyne glycol. A very thin aqueous ceramic green sheet is provided that is free from pin holes, and has low surface roughness, high tensile strength and high elongation.

20 Claims, 4 Drawing Sheets m & n NUMBER OF ADDED ETHYLENE OXCIDE UNITS

CERAMIC SLURRY COMPOSITION, CERAMIC GREEN SHEET AND MULTILAYER CERAMIC ELECTRONIC PART

BACKGROUND OF THE INVENTION

1. Field of the Invention

The present invention relates to an aqueous ceramic slurry composition, a ceramic green sheet using the composition and a multilayer ceramic electronic part using the ceramic green sheet.

2. Description of the Related Art

Multilayer ceramic electronic parts have been manufactured by laminating a plurality of ceramic green sheets having a thickness on the order of 10 to several tens of μm to form raw ceramic laminates, followed by firing. In complying with the requirements for miniaturization, weight reduction and implementation of higher densities of multilayer ceramic electronic parts in recent years, however, there has been a demand for ceramic green sheets having a thickness on the order of 3 to 5 μm.

Ceramic green sheets such as those described above are prepared by comprising the steps of, for example, dissolving an organic binder such as a polyvinyl butyral resin into an organic solvent such as a ketone, a hydrocarbon, an alcohol, an ester or an ether alcohol to form an organic vehicle, mixing a ceramic powder with the organic vehicle to form a ceramic slurry in which the ceramic powder is dispersed, subjecting the slurry to a sheet formation process to spread the slurry over a carrier tape by means of a doctor blade method, a roll coating method, a gravure coating method or the like, in order to form sheets having a specific thickness, and drying the sheets to volatize and eliminate the organic solvent from the sheets.

Use of organic solvents imposes a large burden on the working environment. Furthermore, since the organic solvents contained in a ceramic slurry evaporate quickly, there are occasions when boiling and convection of the organic solvents occur in the course of drying the ceramic slurry, generating sheet defects such as pin holes in the dried ceramic green sheets. These defects become the causes of defects in the electric properties of the multilayer ceramic electronic parts eventually prepared by firing raw ceramic laminates formed by laminating a plurality of the ceramic green sheets.

Accordingly, investigations have been made regarding an aqueous ceramic slurry composition wherein an aqueous solvent is used instead of organic solvents and ceramic green sheets are formed, or using an aqueous ceramic slurry comprising an organic vehicle in the form of emulsion in which a water-soluble resin such as an acrylic resin, polyvinyl alcohol, a vinyl acetate-ethylene copolymer or the like, is chosen as an organic binder.

However, water has a surface free energy of 72 mN/m. That is extremely high in comparison with organic solvents, and therefore, aqueous ceramic slurry compositions are inferior in wettability toward materials having a low surface free energy such as a film represented by a carrier tape, tending to cause a problem of sheet defects such as pin holes.

Furthermore, when a water-soluble resin such as a water-soluble acrylic resin or polyvinyl alcohol is used as an organic binder, it is difficult to have its molecular weight increase to a sufficient level, causing a problem in that the tensile strength and elongation of the formed ceramic green sheets are lowered and that thin-layer ceramic green sheets and multilayer ceramic electronic parts using them are difficult to be manufactured.

SUMMARY OF THE INVENTION

It is an object of the present invention to solve these problems, by providing very thin aqueous ceramic green sheets that are substantially free from sheet defects such as pin holes, that have a low level of surface roughness and that have high tensile strength and elongation, and by providing multilayer ceramic electronic parts using them.

Accordingly, one aspect of the present invention is a ceramic slurry composition comprising a ceramic powder, a vehicle comprising an organic binder and an aqueous solvent, and a surfactant comprising an alkyne diol and/or an ethylene oxide addition product of such an alkyne diol.

It is to be noted that the aqueous solvent may be water, or it may be a mixture of water with a small amount of another solvent such as an alcohol, an ether, a ketone or an ester.

It is preferable that the above-described organic binder in the ceramic slurry composition according to the present invention be polyurethane resin particles having an average particle size of about 120 nm or less. Furthermore, the vehicle is preferably in the state of emulsion wherein the polyurethane resin particles are finely dispersed in the aqueous solvent.

It is also preferable that the amount of the above-described surfactant in the ceramic slurry composition according to the present invention is about 1 part by weight or more based on 100 parts by weight of the ceramic powder.

Another aspect of the present invention is a ceramic green sheet formed into the shape of a sheet using a ceramic slurry composition comprising a ceramic powder, a vehicle comprising an organic binder and an aqueous solvent, and a surfactant comprising an alkyne glycol and/or an ethylene oxide addition product of such an alkyne glycol.

It is preferable that regarding the ceramic green sheet according to the present invention, the above-described organic binder consists of polyurethane resin particles having an average particle size of about 120 nm or less. It is also preferable that the vehicle is in the state of emulsion wherein the polyurethane resin particles are finely dispersed in the aqueous solvent.

It is also preferable that the amount of the above-described surfactant in the ceramic slurry composition is about 1 part by weight or more based on 100 parts by weight of the ceramic powder.

Accordingly, it is possible to manufacture a very thin ceramic green sheet having a thickness in the range of about 0.5 to 5 μm.

Still another aspect of the present invention is a multilayer ceramic electronic part comprising a ceramic laminate formed by laminating a plurality of ceramic layers and a terminal electrode formed in such a way that it contacts the ceramic laminate, wherein the ceramic layers are formed by firing the ceramic green sheets according to the present invention.

Further objects, features and advantages of the present invention will become apparent from the following description of the preferred embodiments with reference to the attached figures and tables.

BRIEF DESCRIPTION OF THE DRAWINGS

FIG. 1A is a chemical formula of an alkyne glycol having one triple bond in the molecule, and FIG. 1B is a chemical formula of an ethylene oxide addition product of the alkyne glycol;

DESCRIPTION OF THE PREFERRED EMBODIMENTS

Figure 1A:
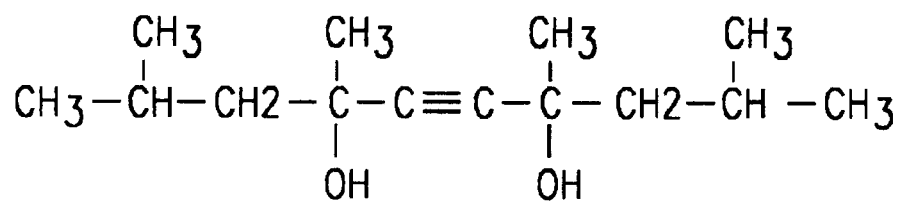
FIGS. 1A and 1B are examples of the chemical formulas of the surfactants used for forming ceramic green sheets according to the present invention.

The ceramic slurry composition according to the present invention contains a surfactant comprising an alkyne glycol having one or more triple bonds and/or an ethylene oxide addition product of such an alkyne glycol. By containing such a surfactant, the wettability of the aqueous ceramic slurry composition is improved as shown by its lower contact angle when it is applied on to a film such as a carrier tape. One example of an alkyne glycol having one triple bond in one molecule is represented by the chemical formula shown in FIG. 1A, and one example of an ethylene oxide addition product of such an alkyne glycol is represented by the chemical formula shown in FIG. 1B.

It is preferable that the vehicle according to the present invention comprises the above-described organic binder and aqueous solvent, and that it is in the state of emulsion. The reasons for choosing a polyurethane resin emulsion as a vehicle in the present invention are categorized roughly into the following three groups.

Firstly, a polyurethane resin has an excellent molecular cohesion since it has urethane bond as well as hydrogen bond between N—H and C=O in the urethane bond section and between N—H in the urethane bond section and O in the other section.

Secondly, a polyurethane resin generally has a segment structure composed of a hard segment and a soft segment, wherein the hard segment furnishes strength and the soft segment furnishes flexibility, and accordingly, a ceramic green sheet that has a desired combination of strength and elongation can be easily obtained by combining the segments properly.

Thirdly, a polyurethane resin in such an emulsion can have a large molecular weight. Accordingly, the emulsion provides better film-forming characteristics than a solution-type organic binder. The emulsion has a low viscosity and the polyurethane resin particles in the emulsion are well dispersed. By virtue of these features of the polyurethane resin emulsion, a ceramic green sheet having strength and elongation suitable for its processing can be obtained even when the content of the emulsion in the aqueous ceramic slurry composition is low.

It is to be noted that the "emulsion" in the present invention generally refers to a material in which a liquid contains another liquid in the form of fine particles, the latter liquid being not dissolved in the former liquid, and it includes what is called a colloidal dispersion.

In the present invention, it is preferable to use an organic binder consisting of polyurethane resin particles having an average particle size of about 120 nm or less. The smaller the average particle size is, the higher are the relative density, tensile strength and elongation of the ceramic green sheet, when the content is constant. If the average particle size is about 120 nm or less, the tensile strength, elongation and surface roughness of the ceramic green sheet are improved remarkably when compared on the same content basis. Generation of sheet defects such as pin holes can also be restricted. The average particle size is more preferably not more than about 50 $\mu$m.

Furthermore, it is preferable that the amount of the surfactant in the ceramic slurry composition is about 1 part by weight or more based on 100 parts by weight of the ceramic powder. By containing about 1 part by weight or more of the surfactant, generation of uncoated areas caused by repelling of the ceramic slurry composition from the surface of a film is restricted in the course of applying the slurry to the surface. When the content of the surfactant is increased, elongation of the ceramic green sheet is improved. However, if the elongation is too large, displacement in stacking may occur when the ceramic green sheets are laminated (stacked). Accordingly, although no specific upper limit exists for the content, it is preferable that the amount of the surfactant is about 2 part by weight or less based on 100 parts by weight of the ceramic powder.

Furthermore, it is preferable that the amount of the organic binder in the ceramic slurry composition is in the range of about 5 to 20 parts by weight based on 100 parts by weight of the ceramic powder. When the amount is not less than about 5 parts by weight, the ceramic green sheet can have a sufficiently high tensile strength and elongation so that it can be used for multilayer ceramic electronic parts, and it can be handled without worrying about sheet breakage. When a plurality of the ceramic green sheets are laminated and pressed, a sufficient adhesion can also be realized between them. On the other hand, when the amount is not more than about 20 parts by weight, the ceramic green sheet can have a sufficiently high density so that it can be used for multilayer ceramic electronic parts. Furthermore, the amount of carbonaceous residue is small when the raw ceramic laminate is fired to eliminate the binder. This is another advantage. The amount is more preferably in the range of about 6 to 10 parts by weight, and it is still more preferably in the range of about 8 to 10 parts by weight, both based on 100 parts by weight of the ceramic powder.

Very thin ceramic green sheets having a thickens in the range of about 0.5 to 5 $\mu$m, and even in the range of about 0.5 to 4 $\mu$m, can be obtained by forming ceramic green sheets using the ceramic slurry composition according to the present invention.

Figure 2:
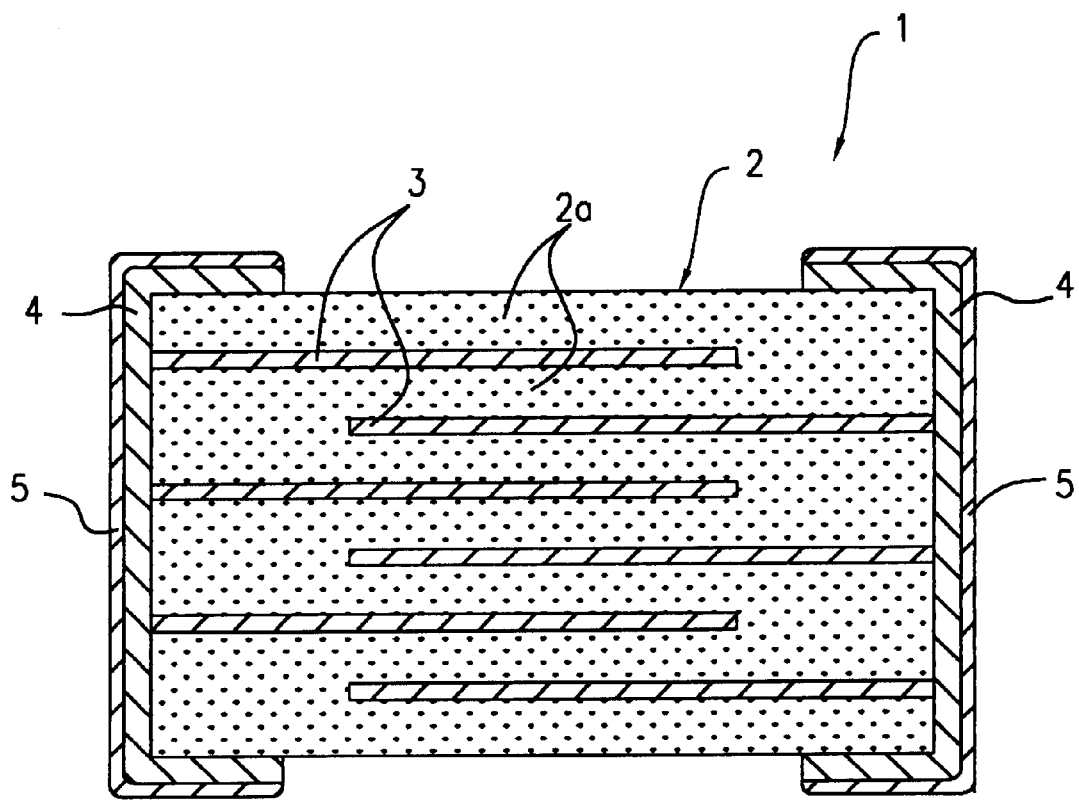
FIG. 2 is a cross-sectional view of a multilayer ceramic electronic part according to an embodiment of the present invention.

Next, one embodiment of the multilayer ceramic electronic part according to the present invention will be described in detail based on FIG. 2.

A multilayer ceramic electronic part 1 is composed of a ceramic laminate 2, internal electrodes 3, terminal electrodes 4 and plating films 5.

The ceramic laminate 2 is prepared by comprising the steps of forming ceramic green sheets from a ceramic slurry comprising a dielectric ceramic powder having $BaTiO_3$ as the main component, and the above-described vehicle and surfactant, cutting the ceramic green sheets to a specific size, laminating the cut green sheets to form a raw ceramic laminate and firing the raw laminate.

The internal electrodes 3 are located between the ceramic layers 2a of the ceramic laminate 2. They are formed by printing a specific pattern on the ceramic green sheets with an electroconductive paste, followed by firing the pattern together with the ceramic green sheets.

The internal electrodes 3 are formed so that one end of the electrodes 3 is exposed on either edge surface of the ceramic laminate 2. The terminal electrodes 4 are formed by applying an electroconductive paste on to the edge surfaces of the ceramic laminate 2, followed by firing, so that they are electrically and mechanically connected to the end of the internal electrodes 3 exposed on the edge surface of the ceramic laminate 2.

The plating films 5 are composed, for example, of Sn, Ni or other metal by electroless plating, solder plating or the like, and are formed over the terminal electrodes 4 in the shape of at least one layer.

It is to be noted that the ceramic material for the ceramic laminate 2 for use in the multilayer ceramic electronic part according to the present invention is not limited only to the above-described dielectric ceramic powder having $BaTiO_3$ as the main component. For example, dielectric materials such as $PbZrO_3$, insulating materials, magnetic materials, piezoelectric materials and semiconductor materials can also be used.

Furthermore, the number of laminated ceramic layers in the ceramic laminate 2 according to the present invention is not limited only to the number shown in the above-described embodiment, and any number is allowable. Also, the number of the internal electrodes 3 in the multilayer ceramic electronic part according to the present invention is not limited only to the number shown in the above-described embodiment, and any number is allowable. It is also possible that no internal electrode 3 is used. Furthermore, it is not always necessary that the ends of the internal electrodes 3 are exposed on the edge surfaces of the ceramic laminate 2.

Also, it is not always necessary that they are electrically or mechanically connected to the terminal electrodes 4. Furthermore, the plating films 5 are not always an indispensable element in the present invention. Also, there is no limitation to the number of the plating layers.

EXAMPLES

The present invention will be explained below by referring to the concrete examples.

EXAMPLE 1

First, a ceramic material having $BaTiO_3$ as the main component was prepared. Also, organic vehicles (polyurethane resin emulsions) for Sample Nos. 1 to 4 in Table 1 that were in the state of emulsion, and were composed of 40% by weight of polyurethane resin particles having an average molecular weight on the order of 200,000 and having average particle sizes of 20 nm, 50 mn, 120 nm and 190 nm, respectively, and of 60% by weight of water, a dispersing agent for dispersing the raw material uniformly, and an defoaming agent for improving the defoaming characteristics, were prepared.

Figure 1B:
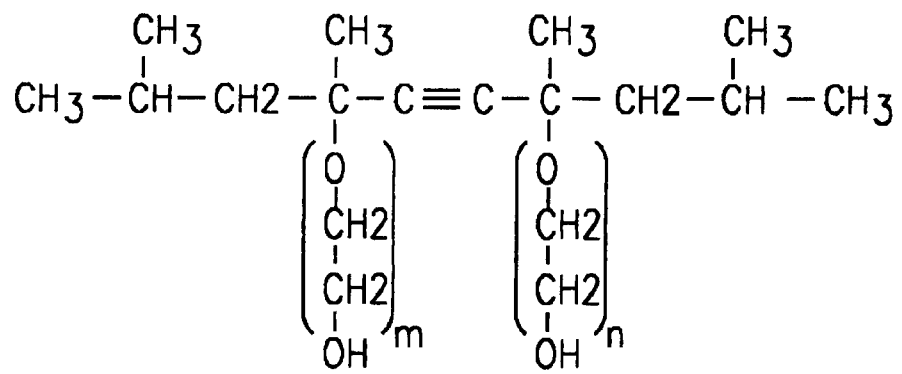

Next, 1.0 part by weight of a surfactant comprising an ethylene oxide addition product of the alkyne glycol having one triple bond in the molecule shown in FIG. 1B with the number of added ethylene oxide units being 4 moles per mole of the alkyne glycol, was added to a mixture of 100 parts by weight of the ceramic material, 20 parts by weight of the solvent, 0.5 parts by weight of the dispersing agent and 0.3 parts by weight of the defoaming agent. The mixture thus obtained was then subjected to blending using a ball mill for two hours so as to make dispersions in which the ceramic powder was sufficiently dispersed.

Next, the vehicles for Sample Nos. 1 to 4 in Table 1, each in an amount of 25 parts by weight, were added to the dispersions. The mixtures obtained were then subjected to blending with a ball mill for additional 16 hours to form aqueous ceramic slurry compositions.

Next, these compositions were subjected to a defoaming process by application of reduced pressure, and then to a sheet forming process using a gravure coater. The sheets thus formed were then dried to form the ceramic green sheets of Sample Nos. 1 to 4 having a thickness of 4.0 μm. It is to be noted that the viscosities of the aqueous ceramic slurries after the defoaming treatment was in the range of 0.10 to 0.12 Pa•s.

The organic-type ceramic slurry for Sample No. 5 was prepared similarly, by blending 100 parts by weight of the above-described ceramic material, 38 parts by weight of a mixture composed of 50% by weight of toluene and 50% by weight of ethanol, 65 parts by weight of an organic vehicle formed by kneading 8 parts by weight of an organic binder composed of a polyvinyl butyral resin and 57 parts by weight of the above-described solvent mixture, 3 parts by weight of a phthalic acid ester plasticizer and 0.5 parts by weight of a dispersing agent. The ceramic green sheets of Sample No. 5 having a thickness of 4.0 μm were formed from the slurry. It is to be noted that the polyvinyl butyral resin was soluble in the solvent. Therefore, it was difficult to measure the particle size. For comparison purposes, one molecule has a length on the order of 600 nm, assuming that its chain is extended straight in the solvent.

Regarding the ceramic green sheets of Sample Nos. 1 to 5, the number of pin holes, surface roughness (Ra), relative density (in %), tensile strength (in MPa), and elongation (in %) were measured. Table 1 summarizes the results.

Figure 3:
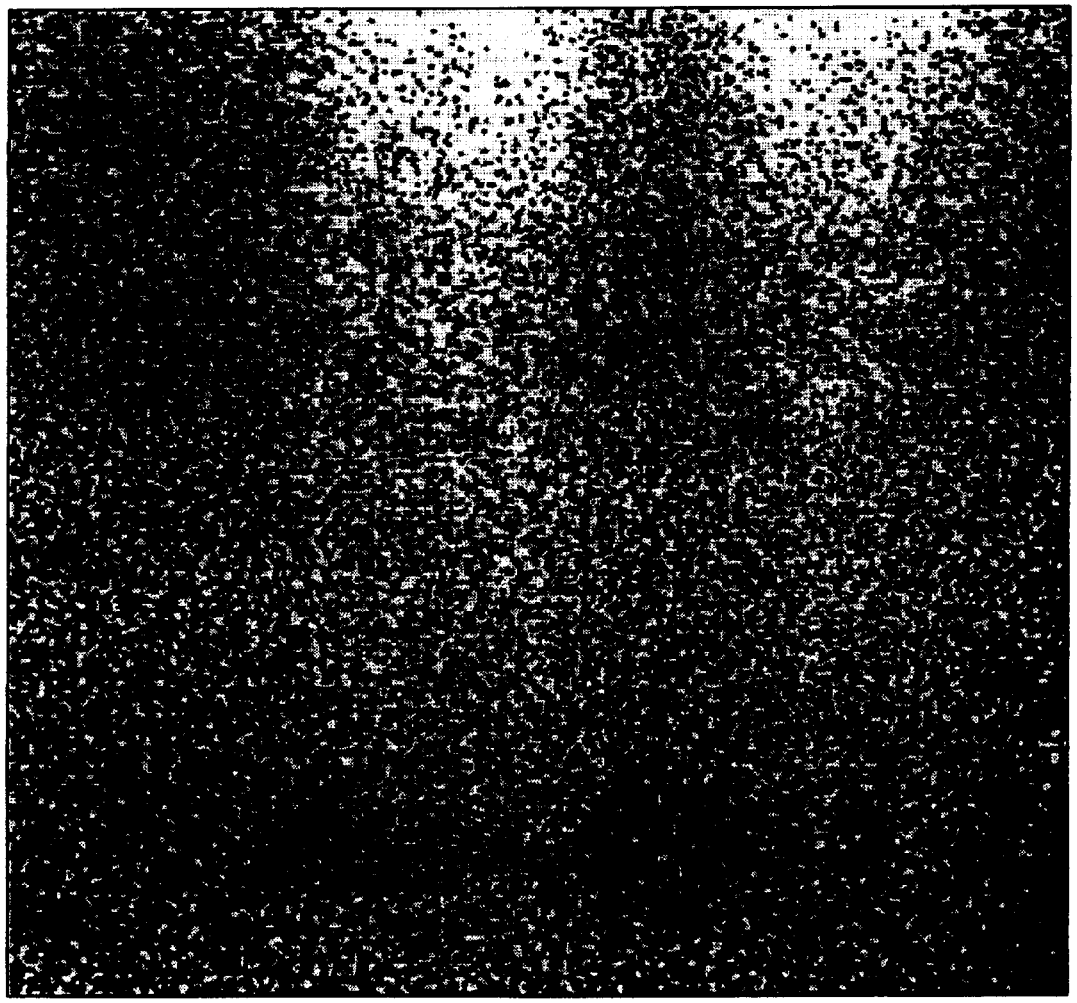
FIG. 3 is reproduction of a microscopic photograph showing the state of the surface of a ceramic green sheet of Sample No. 1 in Example 1 according to the present invention.
Figure 4:
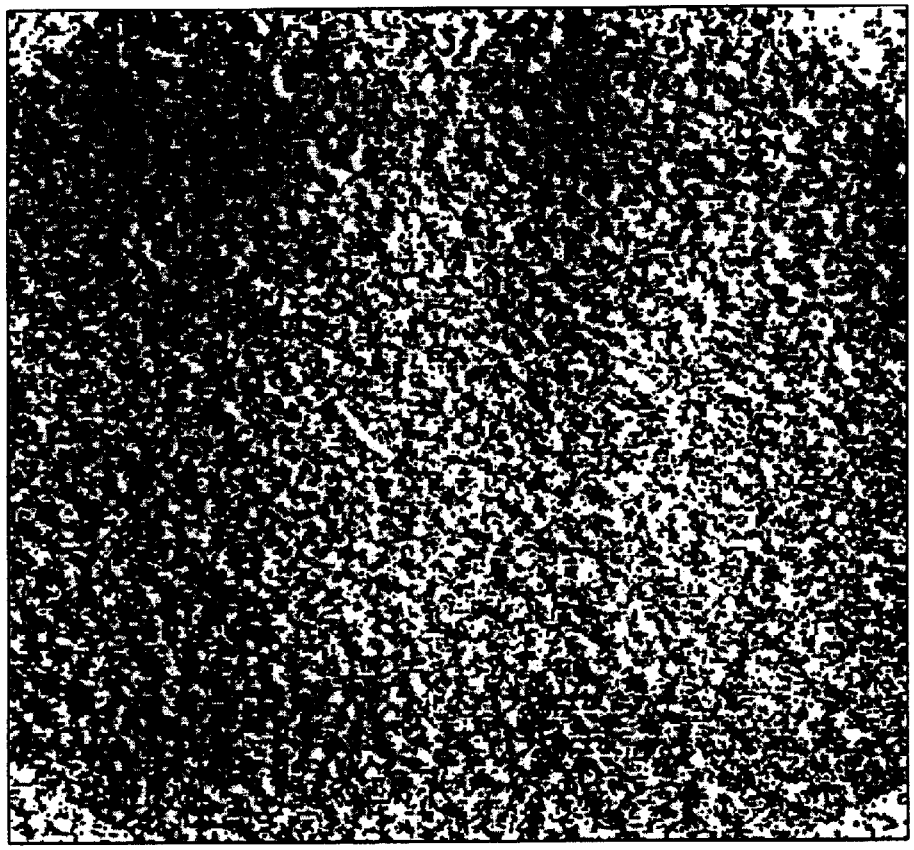
FIG. 4 is reproduction of a microscopic photograph showing the state of the surface of a ceramic green sheet of Sample No. 5 in Example 1 according to the present invention.

Observation under an optical microscope of 200 power magnification was also carried out by illuminating the ceramic green sheets of Sample Nos. 1 and 5 with a light that was incident with an angle along an inclination. Reproductions of some of the pictures taken are shown in FIGS. 3 and 4.

The number of pin holes was determined by the number of pin holes in an area of 45 $cm^2$ of a ceramic green sheet.

The relative density was determined as a theoretical value by means of the following equation, using a 76.0 mm by 58.4 mm sample that was punched out from a ceramic green sheet with a sheet punching machine:

Relative density (%)=(sheet weight/(mold dimension (7.60 cm by 5.84 cm)×sheet thickness))×(weight of the ceramic material powder/(weight of the ceramic material powder+total weight of the added nonvolatile components including the organic binder))/theoretical density (wherein theoretical density or the true density of the powder was set to be 5.83 $g/cm^3$.)

The tensile strength and elongation were determined by punching out specimens in the shape of rectangle of 36.6 mm by 57.6 mm from a ceramic green sheet with a sheet punching machine, and subjecting these specimens to measurement using a tensile strength tester made by Imada Seisakusho. The crosshead speed was 13 mm/min and the temperature was 25° C. at the measurement.

TABLE 1

| Sample No. | Average particle size of polyurethane resin particles (in nm) | Ceramic green sheet | | | | |
|---|---|---|---|---|---|---|
| | | Number of pin holes (in pieces) | Surface roughness (Ra) | Relative density (%) | Tensile strength (MPa) | Elongation (%) |
| 1 | 20 | 0 | 0.10 | 60.9 | 9.5 | 12 |
| 2 | 50 | 0 | 0.12 | 60.8 | 7.0 | 14 |
| 3 | 120 | 0 | 0.14 | 58.1 | 8.4 | 11 |
| 4 | 190 | 17 | 0.18 | 57.0 | 5.0 | 14 |
| 5 | — | 3 | 0.17 | 52.2 | 8.5 | 13 |

As is evident from Table 1, for the ceramic green sheets of Sample Nos. 1 to 3 in which the organic vehicles were in the form of emulsion comprising polyurethane resin particles as organic binders that had average particle sizes of 120 nm or less, the number of pin holes was 0 (zero), the surface roughness was in the range of 0.10 to 0.14, the relative density was in the range of 58.1 to 60.9%, the tensile strength was in the range of 7.0 to 9.5 MPa and the elongation was in the range of 11 to 14%.

The values of the tensile strength and elongation for examples numbers 1 to 3 were roughly equivalent to those of the ceramic green sheet of Sample No. 5 organic-type ceramic green sheet) in which a polyvinyl butyral resin was used as an organic binder and a mixture of toluene and ethanol was used as a solvent. The relative density was higher. Furthermore, when the ceramic green sheets were formed on a film such as a carrier tape, there was no repelling phenomenon observed in which the aqueous ceramic slurry compositions were repelled from the surface of a film. This indicates the wettability of the compositions was sufficient.

In comparison, the ceramic green sheet of Sample 4 in which the organic vehicle was in the form of emulsion comprising polyurethane resin particles as an organic binder that had an average particle size of 190 nm, had a number of pin holes as large as 17.

Furthermore, when FIGS. 3 and 4 are compared with each other, it is understood that the ceramic green sheet of Sample No. 1 (FIG. 3) showed less surface unevenness than the ceramic green sheet of Sample No. 5 (FIG. 4), visually demonstrating the superiority of the former in surface smoothness.

EXAMPLE 2

Aqueous ceramic slurry compositions for Sample Nos. 1a to 3f were prepared and ceramic green sheets of Sample Nos. 1a to 3f were formed by the same method as for Example 1, except that the amount of the polyurethane resin was varied to 20, 15, 10, 8, 6 and 5 parts by weight, respectively, and the vehicles (polyurethane resin emulsions) for Sample Nos. 1a to 3f that were in the form of emulsion and that were composed of 40% by weight of polyurethane resin particles having average particle sizes of 20 nm, 50 nm, and 120 nm and of 60% by weight of water, were used respectively.

Regarding the ceramic green sheets of Sample Nos. 1a to 3f, the number of pin holes, surface roughness (Ra), relative density (in %), tensile strength (in MPa), and elongation (in %) were measured. Table 2 summarizes the results.

TABLE 2

| Sample No. | | Polyurethane resin particles (organic binder) | | Ceramic green sheet | | | | |
|---|---|---|---|---|---|---|---|---|
| | | Average particle size (nm) | Amount (pph of ceramic) | Number of pin holes (pieces) | Surface roughness (Ra) | Relative density (%) | Tensile strength (MPa) | Elongation (%) |
| 1 | a | 20 | 20 | 0 | 0.18 | 57.0 | 10.2 | 14 |
| | b | | 15 | 0 | 0.14 | 59.8 | 9.8 | 14 |
| | c | | 10 | 0 | 0.10 | 60.9 | 9.5 | 12 |
| | d | | 8 | 0 | 0.09 | 61.3 | 7.5 | 11 |
| | e | | 6 | 0 | 0.09 | 61.8 | 4.1 | 8 |
| | f | | 5 | 0 | 0.07 | 63.0 | 2.9 | 4 |
| 2 | a | 50 | 20 | 0 | 0.20 | 55.8 | 8.8 | 15 |
| | b | | 15 | 0 | 0.16 | 58.8 | 7.7 | 16 |
| | c | | 10 | 0 | 0.12 | 60.8 | 7.0 | 14 |
| | d | | 8 | 0 | 0.10 | 61.0 | 4.4 | 12 |
| | e | | 6 | 0 | 0.09 | 61.9 | 3.2 | 7 |
| | f | | 5 | 1 | 0.08 | 62.8 | 1.9 | 5 |
| 3 | a | 120 | 20 | 0 | 0.23 | 55.2 | 9.0 | 16 |
| | b | | 15 | 0 | 0.17 | 57.0 | 8.6 | 13 |
| | c | | 10 | 0 | 0.14 | 58.1 | 8.4 | 11 |
| | d | | 8 | 0 | 0.12 | 59.4 | 7.2 | 9 |
| | e | | 6 | 1 | 0.11 | 61.8 | 5.0 | 6 |
| | f | | 5 | 1 | 0.11 | 63.1 | 2.5 | 3 |

As is evident from Table 2, Samples 1c, 1d, 1e, 2c, 2d, 2e, 3c, 3d and 3e in which the amounts of the organic binder were in the range of 6 to 10 parts by weight based on 100 parts by weight of the ceramic material, had 0 (zero) to 1 pin hole and had an excellent balance of sheet properties including surface roughness, relative density, tensile strength and elongation, regardless of the particle size of the polyurethane resin particles as the organic binder. Among them, Samples 1c, 1d, 2c, 2d, 3c, and 3d in which the amounts of the organic binder were in the range of 8 to 10 parts by weight based on 100 parts by weight of the ceramic material showed relatively high tensile strength and elongation.

Samples 1a, 1b, 2a, 2b, 3a and 3b in which the amounts of the organic binder were not less than 15 parts by weight based on 100 parts by weight of the ceramic material, also showed high tensile strength and elongation, while the surface roughness was relatively high and the relative density was relatively low, indicating that they were somewhat inferior to the above-described samples. However, the properties were within a practically tolerable range. Furthermore, there was no pin hole observed, indicating that the pin hole restricting effect was sufficient.

While Samples 1f, 2f and 3f in which the amounts of the organic binder were 5 parts by weight based on 100 parts by weight of the ceramic material, showed low surface roughness and high relative density, the tensile strength and elongation were relatively low. Accordingly, they were somewhat inferior to the above-described samples. In particular, if the amount of the organic binder was 5 parts by weight based on 100 parts by weight of the ceramic material, the adhesion between the ceramic green sheets tended to be weak when the lamination and pressing process was carried out under a pressure of 20 MPa and at a temperature of 90° C. However, it is quite possible to improve the adhesion, depending on the conditions of the lamination and pressing treatment. Furthermore, the number of pin holes was in the range of 0 (zero) to 1, which is fewer than that of Sample 5 in Example 1. This proves that the pin hole restricting effect was realized.

EXAMPLE 3

In this example, aqueous ceramic slurry compositions for Sample Nos. 2c1, 2c2, 2c4, and 2c5 were prepared, and the ceramic green sheets of Sample Nos. 2c1, 2c2, 2c4, and 2c5 were formed according to the same method as for Sample No. 2c3, except that the ceramic green sheets of Sample No. 2 in Example 2 was used as the ceramic green sheets of Sample No. 2c3, the amounts of the above-described surfactant were set to 0 (zero), 0.5, and 1.5 parts by weight, respectively, and 1.0 part by weight of a sodium salt of olefin-maleic acid copolymer was used as a surfactant for the comparative example (Sample No. 2c5) instead of the above-described surfactant.

Regarding the ceramic green sheets of Sample Nos. 2c1 to 2c5, the tensile strength (in MPa), elongation (in %), contact angle on a carrier film (in degrees), and the presence or absence of repelling of the ceramic slurry compositions from a film at their application on to the film, were measured. Table 3 summarizes the results. It is to be noted that the measurements of the tensile strength and elongation were carried out in the same way as for Example 1. The contact angle on a carrier film was determined by measuring the contact angle of an aqueous ceramic slurry on a film having a surface tension of 34 mN/m, using an Elmer goniometer-type contact angle measuring device (FA Contact AngleMeter CA-Z made by Kyowa Interface Science). The presence or absence of repelling of a ceramic slurry composition was determined by observing, with the naked eye, the surface of a film having a surface tension of 34 mN/m when an aqueous ceramic slurry composition was applied to the film.

TABLE 3

| Sample No. | | Surfactant | | Ceramic green sheet | | | |
| --- | --- | --- | --- | --- | --- | --- | --- |
| | | Name | Amount (pph of ceramic) | Tensile strength (MPa) | Elongation (%) | Contact angle on a film (°) | Repelling of slurry compositions at their application |
| 2c | 1 | — | 0.0 | 8.2 | 9 | 60.0 | YES |
| | 2 | Ethylene oxide addition product of analkyne glycol | 0.5 | 7.5 | 11 | 45.9 | YES |
| | 3 | | 1.0 | 7.0 | 14 | 42.4 | NO |
| | 4 | | 1.5 | 5.9 | 18 | 40.8 | NO |
| | 5 | Na salt of olefin-maleic acid copolymer | 1.0 | 4.7 | 23 | 48.9 | YES |

Table 3 shows that as the addition amount of the surfactant was increased, the elongation was increased, the contact angle was decreased and the repelling phenomenon tended to be less at the application of a ceramic slurry composition on to a film, while the tensile strength was decreased.

Furthermore, in Samples 2c3 and 2c4 in which the amounts of the surfactant were not less than 1.0 part by weight based on 100 parts by weight of the ceramic powder, there was no repelling phenomenon of a ceramic slurry composition observed at its application on to a film. In Sample 2c2 in which the amount of the surfactant was less than 1.0 part by weight based on 100 parts by weight of the ceramic powder, there occurred a repelling phenomenon at the application of a ceramic slurry composition on to a film, but the elongation was improved and the decrease in tensile strength was very slight. Accordingly, the sample was considered to be in an allowable range.

When Sample No. 2c3 ceramic green sheet comprising 1.0 part by weight of the surfactant is compared with Sample No. 2c5 ceramic green sheet comprising the same amount of a different surfactant, that is, 1.0 part by weight of a sodium salt of olefin-maleic acid copolymer, then Sample 2c3 No. ceramic green sheet that used the ethylene oxide addition product of an alkyne glycol having one triple bond in one molecule as a surfactant, provided a better result with a higher tensile strength, a lower contact angle and no repelling phenomenon at the application of the ceramic slurry on to a film.

According to the present invention, the ceramic slurry composition comprises a ceramic powder, an vehicle comprising an organic binder and an aqueous solvent, and a surfactant comprising an alkyne glycol having one or more triple bonds in its molecule and/or an ethylene oxide addition product of such an alkyne glycol. The alkyne diols generally contain 2 to 16 carbon atoms and the ethoxlyated derivatives generally contain 2 to 10 ethylene oxide groups. Accordingly, the composition has an improved wettability with a lowered contact angle when applied on to a film such as a carrier tape, and therefore, a very thin ceramic green sheet with a high reliability can be obtained, even though it is an aqueous ceramic slurry composition.

Furthermore, by choosing polyurethane resin particles having an average particle size of about 120 nm or less as the organic binder, and by having the organic vehicle in the state of emulsion in which the polyurethane resin particles were finely dispersed in the aqueous solvent, a very thin aqueous ceramic green sheet having no sheet defects such as pin holes and with a low surface roughness as well as a high tensile strength and a high elongation can be provided.

Furthermore, by having about 1 part by weight or more of the surfactant in the ceramic slurry composition based on 100 parts by weight of the ceramic powder, the contact angle of the ceramic slurry composition can be decreased when it is applied on to a film such as a carrier tape so that the wettability is improved.

Furthermore, by having about 5 to 20 parts by weight of the organic binder in the ceramic slurry composition based on 100 parts by weight of the ceramic powder, ceramic green sheets free from pin holes and having an excellent balance of sheet properties including surface roughness, relative density, tensile strength and elongation, can be obtained. Accordingly, multilayer ceramic electronic parts having consistent electric properties can be produced from the sheets.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A ceramic slurry composition comprising:
   a ceramic powder;
   a vehicle comprising an organic binder and an aqueous solvent; and
   an alkyne glycol or ethoxylated derivative thereof surfactant.

2. A ceramic slurry composition according to claim 1, wherein said organic binder in said vehicle comprises polyurethane resin particles having an average particle size of about 120 nm or less.

3. A ceramic slurry composition according to claim 2, wherein said vehicle is an emulsion of said polyurethane resin particles dispersed in said aqueous solvent.

4. A ceramic slurry composition according to claim 1, wherein the amount of said surfactant in said ceramic slurry composition is at least about 1 part by weight based on 100 parts by weight of said ceramic powder.

5. A ceramic slurry composition according to claim 1, wherein the amount of said organic binder in said ceramic slurry composition is about 5 to 20 parts by weight based on 100 parts by weight of said ceramic powder.

6. A ceramic slurry composition according to claim 5, wherein the vehicle is an emulsion of said polyurethane resin particles having an average particle size of about 120 nm or less dispersed in said aqueous solvent and wherein the amount of said surfactant in said ceramic slurry composition is at least about 1 part by weight based on 100 parts by weight of said ceramic powder.

7. A ceramic slurry composition according to claim 6, wherein said polyurethane resin particles have an average particle size of about 50 nm or less and constitute about 6 to 10 parts by weight of the composition and wherein the amount of said surfactant in said ceramic slurry composition is about 2 parts by weight or less based on 100 parts by weight of said ceramic powder.

8. A ceramic slurry composition according to claim 6 disposed in the form of a green sheet of the ceramic slurry composition.

9. A ceramic green sheet according to claim 8, wherein said ceramic green sheet has a thickness of about 0.5 to 5 µm.

10. A ceramic slurry composition according to claim 5 disposed in the form of a sheet of the ceramic slurry composition.

11. A ceramic slurry composition according to claim 4 disposed in the form of a sheet of the ceramic slurry composition.

12. A ceramic slurry composition according to claim 3 disposed in the form of a sheet of the ceramic slurry composition.

13. A ceramic slurry composition according to claim 2 disposed in the form of a sheet of the ceramic slurry composition.

14. A ceramic slurry composition according to claim 1 disposed in the form of a green sheet of the ceramic slurry composition.

15. A ceramic green sheet according to claim 14, wherein said green sheet has a thickness of about 0.5 to 5 µm.

16. A ceramic green sheet according to claim 15, wherein said green sheet has a thickness of about 0.5 to 4 µm.

17. A multilayer ceramic electronic part comprising:
   a ceramic laminate comprising a plurality of ceramic layers; and
   a terminal electrode in contact with said ceramic laminate,
   wherein at least one of said ceramic layers is a fired ceramic green sheet according to claim 15.

18. A multilayer ceramic electronic part comprising:
   a ceramic laminate comprising a plurality of ceramic layers; and
   a terminal electrode in contact with said ceramic laminate,
   wherein at least one of said ceramic layers is a fired ceramic green sheet according to claim 14.

19. A multilayer ceramic electronic part comprising:
   a ceramic laminate comprising a plurality of ceramic layers; and
   a terminal electrode in contact with said ceramic laminate,
   wherein at least one of said ceramic layers is a fired ceramic green sheet according to claim 12.

20. A multilayer ceramic electronic part comprising:
   a ceramic laminate comprising a plurality of ceramic layers; and
   a terminal electrode in contact with said ceramic laminate,
   wherein at least one of said ceramic layers is a fired ceramic green sheet according to claim 10.

* * * * *